United States Patent
Lee et al.

(10) Patent No.: US 9,379,319 B2
(45) Date of Patent: Jun. 28, 2016

(54) NONVOLATILE MEMORY TRANSISTOR AND DEVICE INCLUDING THE SAME

(71) Applicant: Samsung Electronics Co., Ltd., Suwon-si (KR)

(72) Inventors: Myoung-jae Lee, Hwaseong-si (KR); Seong-ho Cho, Gwacheon-si (KR); Ho-jung Kim, Suwon-si (KR); Young-soo Park, Yongin-si (KR); David Seo, Yongin-si (KR); In-kyeong Yoo, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 35 days.

(21) Appl. No.: 14/444,083

(22) Filed: Jul. 28, 2014

(65) Prior Publication Data

US 2015/0028278 A1 Jan. 29, 2015

(30) Foreign Application Priority Data

Jul. 29, 2013 (KR) ........................ 10-2013-0089833

(51) Int. Cl.
*H01L 29/02* (2006.01)
*H01L 45/00* (2006.01)
(Continued)

(52) U.S. Cl.
CPC .............. *H01L 45/085* (2013.01); *G06N 3/049* (2013.01); *G06N 3/063* (2013.01); *G11C 11/54* (2013.01);
(Continued)

(58) Field of Classification Search
CPC . H01L 45/085; H01L 45/147; H01L 45/1206; H01L 29/408; H01L 29/512; H01L 29/517; H01L 29/78; G06N 3/049; G06N 3/063; G11C 11/54; G11C 11/5685; G11C 13/0007; G11C 2213/15; G11C 2213/53
USPC ....................................................... 257/2, 197
See application file for complete search history.

(56) References Cited

U.S. PATENT DOCUMENTS 6,831,325 B2 12/2004 Lojek
7,180,126 B2 2/2007 Lojek
(Continued)

FOREIGN PATENT DOCUMENTS

EP 2416391 A2 2/2012
EP 2416391 A3 1/2013
(Continued)

OTHER PUBLICATIONS

Eshraghian, Evolution of Nonvolatile Resistive Switching Memory Technoligies: The Related Influence on Hetrogeneous Nanoarchitrctures, Transactions on Electrical and Electronic Materials, vol. 11, No, 6, pp. 243-248, Dec. 25, 2010.
(Continued)

*Primary Examiner* — Thanh T Nguyen
(74) *Attorney, Agent, or Firm* — Onello & Mello LLP

(57) ABSTRACT

Provided are nonvolatile memory transistors and devices including the nonvolatile memory transistors. A nonvolatile memory transistor may include a channel element, a gate electrode corresponding to the channel element, a gate insulation layer between the channel element and the gate electrode, an ionic species moving layer between the gate insulation layer and the gate electrode, and a source and a drain separated from each other with respect to the channel element. A motion of an ionic species at the ionic species moving layer occurs according to a voltage applied to the gate electrode. A threshold voltage changes according to the motion of the ionic species. The nonvolatile memory transistor has a multi-level characteristic.

13 Claims, 13 Drawing Sheets

(51) Int. Cl.

| | | |
|---|---|---|
| *H01L 29/40* | (2006.01) | |
| *H01L 29/51* | (2006.01) | |
| *H01L 29/78* | (2006.01) | |
| *G06N 3/04* | (2006.01) | |
| *G06N 3/063* | (2006.01) | |
| *G11C 11/54* | (2006.01) | |
| *G11C 11/56* | (2006.01) | |
| *G11C 13/00* | (2006.01) | |

(52) U.S. Cl.
CPC ........ *G11C 11/5685* (2013.01); *G11C 13/0007* (2013.01); *H01L 29/408* (2013.01); *H01L 29/512* (2013.01); *H01L 29/517* (2013.01); *H01L 29/78* (2013.01); *H01L 45/1206* (2013.01); *H01L 45/147* (2013.01); *G11C 2213/15* (2013.01); *G11C 2213/53* (2013.01)

(56) References Cited

U.S. PATENT DOCUMENTS

| | | |
|---|---|---|
| 7,842,991 B2 | 11/2010 | Cho et al. |
| 8,043,926 B2 | 10/2011 | Cho et al. |
| 2003/0142533 A1* | 7/2003 | Ueda ...................... G11C 11/22 365/145 |
| 2003/0218221 A1 | 11/2003 | Wager, III et al. |
| 2004/0119112 A1 | 6/2004 | Lojek |
| 2005/0062092 A1 | 3/2005 | Lojek |
| 2006/0223251 A1* | 10/2006 | Isogai ............... H01L 29/78391 438/197 |
| 2007/0134875 A1 | 6/2007 | Lojek |
| 2007/0267675 A1 | 11/2007 | Cho et al. |
| 2011/0059576 A1 | 3/2011 | Cho et al. |
| 2012/0025187 A1 | 2/2012 | Park et al. |
| 2012/0032132 A1 | 2/2012 | Lee et al. |

FOREIGN PATENT DOCUMENTS

| | | |
|---|---|---|
| KR | 2002001145 | 1/2002 |
| KR | 2005084343 | 8/2005 |
| KR | 100744566 | 7/2007 |
| KR | 2007111840 | 11/2007 |
| KR | 2007118865 | 12/2007 |
| KR | 2010007467 | 1/2010 |
| KR | 2011024479 | 3/2011 |
| KR | 2012021454 | 3/2012 |
| KR | 2012127166 | 11/2012 |
| KR | 2013033707 | 4/2013 |

OTHER PUBLICATIONS

Extended European Search Report dated Jan. 29, 2015, issued in corresponding European Application No. 14178404.1
Next Generation Non-Volatile Oxide RERAM, Sep. 2005, pp. 29-39.

* cited by examiner

NONVOLATILE MEMORY TRANSISTOR AND DEVICE INCLUDING THE SAME

CROSS-REFERENCE TO RELATED APPLICATIONS

This application claims the benefit of Korean Patent Application No. 10-2013-0089833, filed on Jul. 29, 2013, in the Korean Intellectual Property Office, the disclosure of which is incorporated herein in its entirety by reference.

BACKGROUND

1. Field

The present disclosure relates to nonvolatile memory transistors and devices including the same.

2. Description of the Related Art

Flash memories are widely used and well-known for use in nonvolatile memory devices. In a typical flash memory transistor, data is stored by filling or removing electrons in or from a floating gate through a tunnel insulation layer. However, since a typical flash memory uses a tunnel injection of electrons, an operating voltage of the flash memory is high, for example, about 10-20 V. Also, since the number of electrons trapped in the floating gate is limited, it may be difficult to embody a flash memory with a multi-bit characteristic. For example, a mere tens of electrons may be trapped in a floating gate having a linewidth of about 20-30 nm.

To overcome the abovementioned problems of a conventional flash memory, there is a demand for a nonvolatile memory device having a low operating voltage and having a sufficiently large multi-level characteristic even when the nonvolatile memory device is of a small size.

SUMMARY

Provided are nonvolatile memory transistors having a multi-level or multi-value characteristic.

Provided are nonvolatile memory transistors having a low operating voltage.

Provided are nonvolatile memory transistors having a characteristic such as a threshold voltage that is gradually or continuously changed by a voltage application.

Provided are devices, for example, circuits, including nonvolatile memory transistors.

Provided are synapse devices employing nonvolatile memory transistors.

Provided are methods of operating nonvolatile memory transistors and devices including the nonvolatile memory transistors.

Additional aspects will be set forth in part in the description which follows and, in part, will be apparent from the description, or may be learned by practice of the presented embodiments.

According to an aspect of the present inventive concept, a nonvolatile memory transistor includes a channel element, a gate electrode corresponding to the channel element, a gate insulation layer between the channel element and the gate electrode, an ionic species moving layer between the gate insulation layer and the gate electrode, and a source and a drain separated from each other with respect to the channel element. A motion of an ionic species at the ionic species moving layer occurs according to a voltage applied to the gate electrode, wherein a threshold voltage changes according to the motion of the ionic species, and wherein the nonvolatile memory transistor has a multi-level characteristic.

In some embodiments, the ionic species moving layer includes a variable resistance material.

In some embodiments, the ionic species moving layer includes a bipolar memory layer.

In some embodiments, the ionic species moving layer includes at least one of PrCaMnO (PCMO), Ti oxide, Ta oxide, Ni oxide, Zn oxide, W oxide, Co oxide, Nb oxide, TiNi oxide, LiNi oxide, InZn oxide, V oxide, SrZr oxide, SrTi oxide, Cr oxide, Fe oxide, Cu oxide, Hf oxide, Zr oxide, Al oxide, and a mixture thereof.

In some embodiments, the ionic species moving layer includes PCMO.

In some embodiments, the ionic species moving layer include negative (−) ionic species and the threshold voltage increases as a concentration of the negative (−) ionic species in the ionic species moving layer increases in a direction toward the gate insulation layer.

In some embodiments, the ionic species moving layer includes positive (+) ionic species and the threshold voltage decreases as a concentration of the positive (+) ionic species in the ionic species moving layer increases in a direction toward the gate insulation layer.

In some embodiments, the ionic species moving layer includes at least one of oxygen ions or oxygen vacancies as the ionic species.

In some embodiments, the nonvolatile memory transistor may further include a conductive layer between the gate insulation layer and the ionic species moving layer.

In some embodiments, the nonvolatile memory transistor has a multi-level characteristic including at least sixteen (16) levels.

In some embodiments, the ionic species moving layer has a monolayer structure.

In some embodiments, the ionic species moving layer has a multilayer structure.

According to another aspect of the present inventive concept, a nonvolatile memory transistor includes a channel element, a gate electrode that corresponds to the channel element, a gate insulation layer between the channel element and the gate electrode, a bipolar memory layer between the gate insulation layer and the gate electrode, and a source and a drain separated from each other with respect to the channel element.

In some embodiments, the nonvolatile memory transistor includes an electrode layer between the gate insulation layer and the bipolar memory layer.

According to another aspect of the present inventive concept, a synapse device includes a nonvolatile memory transistor. The nonvolatile memory transistor comprises a channel element; a gate electrode corresponding to the channel element; a gate insulation layer between the channel element and the gate electrode; an ionic species moving layer between the gate insulation layer and the gate electrode; and a source and a drain separated from each other with respect to the channel element, wherein a motion of an ionic species at the ionic species moving layer occurs according to a voltage applied to the gate electrode, wherein a threshold voltage changes according to the motion of the ionic species, and wherein the nonvolatile memory transistor has a multi-level characteristic.

In some embodiments, a gate electrode of the nonvolatile memory transistor is connected to a pre-synaptic neuron circuit and a source of the nonvolatile memory transistor is connected to a post-synaptic neuron circuit.

In some embodiments, a plurality of nonvolatile memory transistors are arranged in a plurality of rows and columns.

In some embodiments, the synapse device includes a plurality of first wirings and a plurality of second wirings crossing the plurality of first wirings, in which the plurality of nonvolatile memory transistors are located at intersections of the plurality of first wirings and the plurality of second wirings.

In some embodiments, the plurality of first wirings are connected to a pre-synaptic neuron circuit and the plurality of second wirings are connected to a post-synaptic neuron circuit.

According to another aspect of the present inventive concept, a neuromorphic device includes a synapse device. The synapse device comprises a nonvolatile memory transistor. The nonvolatile memory transistor comprises a channel element; a gate electrode corresponding to the channel element; a gate insulation layer between the channel element and the gate electrode; an ionic species moving layer between the gate insulation layer and the gate electrode; and a source and a drain separated from each other with respect to the channel element, wherein a motion of an ionic species at the ionic species moving layer occurs according to a voltage applied to the gate electrode, wherein a threshold voltage changes according to the motion of the ionic species, and wherein the nonvolatile memory transistor has a multi-level characteristic.

In some embodiments, the neuromorphic device further includes a complementary metal-oxide-semiconductor (CMOS) neuron circuit connected to the synapse device.

According to another aspect of the present inventive concept, a method of operating the nonvolatile memory transistor includes moving ionic species in the ionic species moving layer by applying a voltage to the gate electrode, and turning on the nonvolatile memory transistor.

In some embodiments, in the moving of the ionic species, the voltage applied to the ionic species moving layer is within a range of about ±5.0 V.

According to another aspect of the present inventive concept, a nonvolatile memory transistor comprises a source; a drain; a gate electrode; a channel element between the source and the drain; and an ionic species moving layer between the gate electrode and the channel element, wherein a threshold voltage of the nonvolatile memory transistor changes in response to a movement of ions in the ionic species moving layer.

In some embodiments, the nonvolatile memory transistor has a multi-level characteristic.

In some embodiments, the ionic species moving layer includes a bipolar memory layer.

In some embodiments, the ionic species moving layer includes an electrostatic potential that is changed by moving the ionic species according to a voltage applied to the gate electrode.

In some embodiments, the ionic species includes at least one of oxygen ions or oxygen vacancies.

In some embodiments, the nonvolatile memory transistor further comprises a gate insulation layer between the ionic species movable layer and the channel element.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
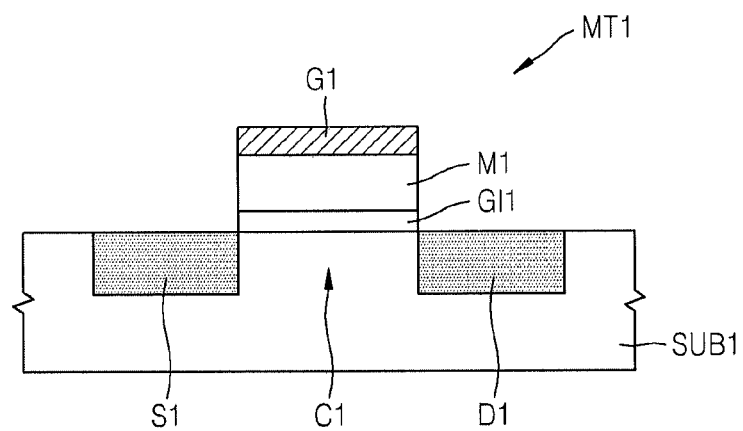
FIG. 1 is a cross-sectional view illustrating a nonvolatile memory transistor according to an embodiment of the present inventive concept.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

FIG. 1 is a cross-sectional view illustrating a nonvolatile memory transistor MT1 according to an embodiment of the present inventive concept.

Referring to FIG. 1, a channel element C1 and a gate electrode G1 corresponding to the channel element C1 may be provided. A gate insulation layer GI1 may be provided between the channel element C1 and the gate electrode G1. An ionic species moving layer M1, also referred to as an ionic species movable layer, may be provided between the gate insulation layer GI1 and the gate electrode G1. The gate insulation layer GI1, the ionic species moving layer M1, and the gate electrode G1 may be sequentially provided on the channel element C1. A source S1 and a drain D1 may be provided at opposite sides of the channel element C1, and spaced apart from each other. The source S1 and the drain D1 may contact opposite ends of a portion of the channel element C1 between the source S1 and the drain D1. The source S1, the drain D1, and the channel element C1 may be provided at a substrate SUB1. The source S1 and the drain D1 may be formed by injecting predetermined impurities into areas of the substrate SUB1 at opposite sides of the gate electrode G1. A region of the substrate SUB1 between the source S1 and the drain D1 may be defined as the channel element (channel region) C1. The substrate SUB1 may be formed of, for example, a silicon (Si) substrate.

The ionic species moving layer M1 may have a predetermined ionic species. For example, the ionic species may include oxygen ions and/or oxygen vacancies. As a voltage is applied between opposite ends, e.g., upper and lower ends, of the ionic species moving layer M1, the predetermined ionic species may move within the ionic species moving layer M1. A threshold voltage of the nonvolatile memory transistor MT1 may vary according to the movement of the ionic species in the ionic species moving layer M1. In this regard, the nonvolatile memory transistor MT1 may have a multi-level characteristic. For example, the nonvolatile memory transistor MT1 may have a multi-level characteristic of 16 levels or more.

The ionic species moving layer M1 may include a resistive memory material. In this case, the ionic species moving layer M1 may include an oxide resistor. The oxide resistor may be a metal oxide resistor or the like, and may be formed of a variable resistance material having a resistance that varies according to an applied voltage. The variable resistance material may be formed of a bipolar memory material. The ionic species moving layer M1 may include at least one of PrCaMnO (PCMO), Ti oxide, Ta oxide, Ni oxide, Zn oxide, W oxide, Co oxide, Nb oxide, TiNi oxide, LiNi oxide, InZn oxide, V oxide, SrZr oxide, SrTi oxide, Cr oxide, Fe oxide, Cu oxide, Hf oxide, Zr oxide, Al oxide, and a mixture thereof. The above materials may have a unipolar or bipolar characteristic according to formation conditions. In the present embodiment, a bipolar characteristic of the above materials may be used. Also, the characteristics of the above materials may be greatly changed according to their composition ratios. Accordingly, the above materials are understood to have a composition ratio that may indicate the resistance change characteristic and/or the bipolar characteristic. In the case of an Al oxide, an oxide, such as $Al_2O_3$, or the like having a chemical stoichiometric composition, may have a dielectric (insulating) characteristic but may not have the resistance change characteristic and/or the bipolar characteristic. Accordingly, the above-described Al oxide may be understood to have a nonstoichiometric composition indicating the resistance change characteristic and/or the bipolar characteristic. This may be also valid with respect to other materials referred to herein and/or otherwise known to those of ordinary skill in the art. The thickness of the ionic species moving layer M1 may be about 10-100 nm, for example, about 20-80 nm.

In FIG. 1, a voltage may be applied between the upper and lower ends of the ionic species moving layer M1 due to a difference (hereinafter, referred to as a voltage difference) between a voltage applied to the gate electrode G1 and a voltage applied to a body of the substrate SUB1. The voltage corresponding to the voltage difference may be distributively applied to the gate insulation layer GI1 and the ionic species moving layer M1. In some embodiments, the ionic species may move in the ionic species moving layer M1 due to the voltage applied to the ionic species moving layer M1. Assuming that a predetermined voltage is constantly applied to the body of the substrate SUB1, the ionic species may move in the ionic species moving layer M1 due to the voltage applied to the gate electrode G1. The ionic species may move in the ionic species moving layer M1 due to an electric field applied between the upper and lower ends of the ionic species moving layer M1, for example, an electric field generated by the voltage applied to the gate electrode G1.

Figure 2:
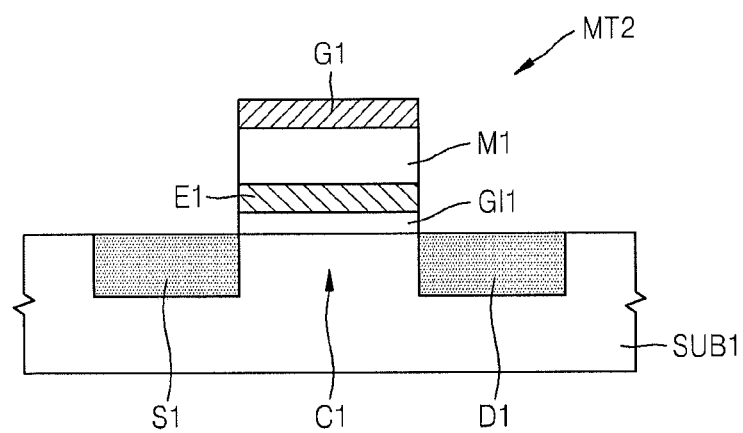
FIG. 2 is a cross-sectional view illustrating a nonvolatile memory transistor according to another embodiment of the present inventive concept.

According to another embodiment of the present inventive concept, a conductive layer E1 may be positioned between the gate insulation layer GI1 and the ionic species moving layer M1, for example, in FIG. 2.

Referring to FIG. 2, a nonvolatile memory transistor MT2 according to the present embodiment may further include a conductive layer E1 provided between the gate insulation layer GI1 and the nonvolatile memory transistor MT1. The conductive layer E1 may be constructed to function as an electrode layer and may be formed of metal or a metal compound. The ionic species moving layer M1 may be regarded as being between the two electrodes E1 and G1. As such, when the conductive layer E1 is provided, the application of a voltage or an electric field to the ionic species moving layer M1 may be facilitated. Accordingly, a movement of ionic species of the ionic species moving layer M1 may be facilitated.

As the ionic species, for example, oxygen ions and/or oxygen vacancies, move in the ionic species moving layer M1, an electrostatic potential of the ionic species moving layer M1 may vary. Thus, the threshold voltages of the nonvolatile memory transistors MT1 and MT2 may vary. In other words, as the ionic species move in the ionic species moving layer M1, the distribution of ionic species of the ionic species moving layer M1 can vary. Thus, an electric influence of the ionic species moving layer M1 on the channel element C1 may vary. As a result, the threshold voltages of the nonvolatile memory transistors MT1 and MT2, respectively, may vary. When the ionic species are negative (−) ionic species, as the concentration of the negative (−) ionic species in the ionic species moving layer M1 increases toward the gate insulation layer GI1, the threshold voltage may increase. When the ionic species are positive (+) ionic species, as the concentration of the positive (+) ionic species in the ionic species moving layer M1 increases toward the gate insulation layer GI1, the threshold voltage may decrease. The ionic species of the ionic species moving layer M1 may move gradually in a continuous manner, and reversibly, in the ionic species moving layer M1. Accordingly, the threshold voltages of the nonvolatile memory transistors MT1 and MT2 may also change gradually and reversibly. From another viewpoint, the ionic species of the ionic species moving layer M1 may move due to an electric field applied between the upper and lower ends of the ionic species moving layer M1. As a result, an internal electric field may be changed in the ionic species moving layer M1. The intensity of the internal electric field may vary according to the movement of the ionic species. The internal electric field may vary gradually and reversibly. The threshold voltages of the nonvolatile memory transistors MT1 and MT2 may be changed due to such a change of the internal electric field. Also, a capacitance in a predetermined region of the ionic species moving layer M1 may change according to the movement of the ionic species, and the threshold voltage may vary due to the change of the capacitance. The change of the threshold voltage according to the movement of the ionic species of the ionic species moving layer M1 will be described later in greater detail.

Figure 3:
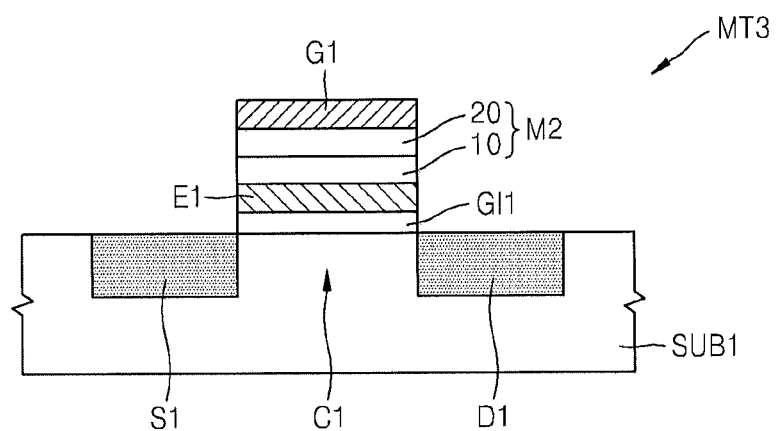
FIG. 3 is a cross-sectional view illustrating a nonvolatile memory transistor according to another embodiment of the present inventive concept.

According to another embodiment of the present inventive concept, the ionic species moving layer M1 in the structure of FIGS. 1 and 2 may be formed in a multilayer structure. An example of a multilayer structure is illustrated in FIG. 3. More specifically, FIG. 3 illustrates a case in which the ionic species moving layer M1 of FIG. 2 has a multilayer structure.

Referring to FIG. 3, a nonvolatile memory transistor MT3 according to a present embodiment may include an ionic species moving layer M2 of a multilayer structure. The ionic species moving layer M2 may include, for example, a dual layer structure. In this case, the ionic species moving layer M2 may include a first material layer 10 and a second material layer 20. Oxygen ions and/or oxygen vacancies may be in the first material layer 10. The first material layer 10 may function as "an oxygen supplying layer" with respect to the second material layer 20. The first material layer 10 may also be referred to as "an oxygen reservoir layer". The second material layer 20 may be similar to the first material layer 10, and may include the oxygen ions and/or oxygen vacancies. The second material layer 20 may exchange oxygen ions and/or oxygen vacancies with the first material layer 10 and may induce a resistance change of the ionic species moving layer M2. In this regard, the second material layer 20 may be referred to as "an oxygen exchange layer". The oxygen concentration of the second material layer 20 may be higher than that of the first material layer 10.

Figure 4:
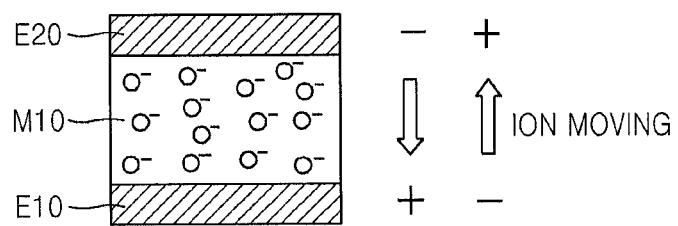
FIG. 4 is a cross-sectional view illustrating a cell structure for measuring a resistance change characteristic of an ionic species moving layer that may be used for nonvolatile memory transistors according to embodiments of the present inventive concept.

FIG. 4 is a cross-sectional view illustrating a cell structure for measuring a resistance change characteristic of an ionic species moving layer that may be used for nonvolatile memory transistors according to the embodiments of the present inventive concept.

Referring to FIG. 4, an ionic species moving layer M10 is provided between two electrodes (hereinafter, referred to as first and second electrodes) E10 and E20. The ionic species moving layer M10 may have a large amount of oxygen ions. The oxygen ions may move in response to a voltage applied between the first and second electrodes E10 and E20. For example, when a positive (+) voltage is applied to the first electrode E10 and a negative (−) voltage is applied to the second electrode E20, the oxygen ions may move toward the first electrode E10 to some degree. When a negative (−) voltage is applied to the first electrode E10 and a positive (+) voltage is applied to the second electrode E20, the oxygen ions may be moved toward the second electrode E20 to some degree. If the same voltage signal is repeatedly applied between the two electrodes E10 and E20, the oxygen ions may gradually (accumulatively) move in any one direction according to the frequency of applications of the signal. The oxygen vacancies (not shown) of the ionic species moving layer M10 may move in a direction opposite the oxygen ions. The oxygen ions may have negative (−) charges, whereas the oxygen vacancies may have positive (+) charges.

Figure 5:
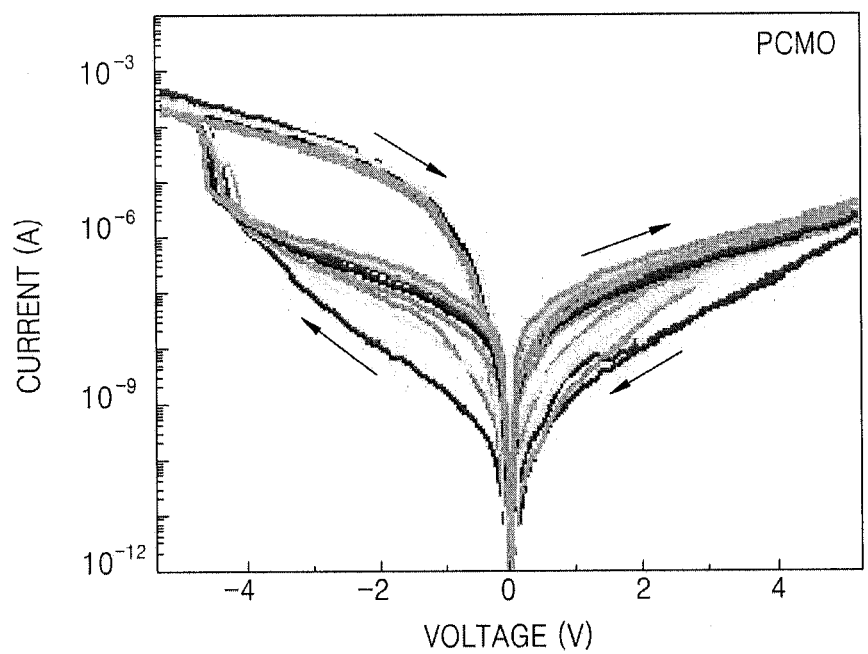
FIGS. 5 and 6 are graphs showing a resistance change characteristic according to a voltage applied to an ionic species moving layer in a structure according to embodiments of the present inventive concept.
Figure 6:
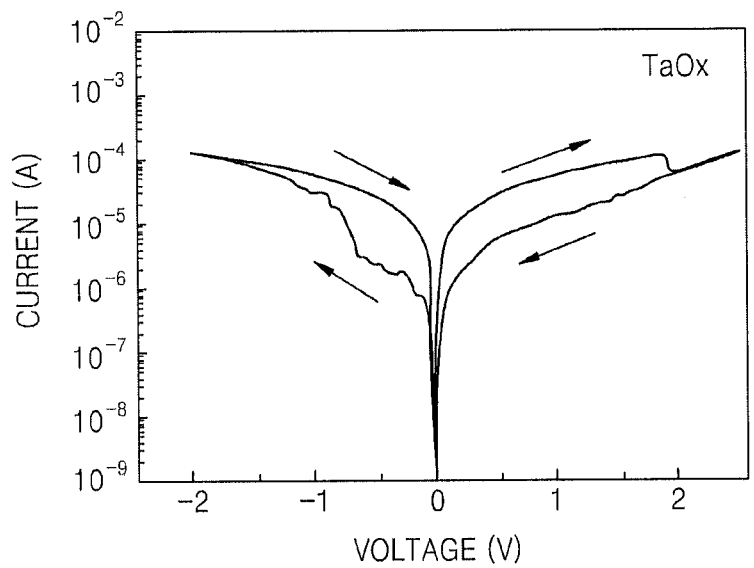

FIGS. 5 and 6 are graphs showing a resistance change characteristic according to an applied voltage of an ionic species moving layer that may be used for a nonvolatile memory transistor according to the embodiments of the present inventive concept. FIGS. 5 and 6 show a voltage-current characteristic change of the structure of FIG. 4. FIG. 5 shows a case in which an ionic species moving layer M10 of FIG. 4 is a PCMO layer. FIG. 6 shows a case in which the ionic species moving layer M10 of FIG. 4 is a TaOx layer. FIG. 5 shows a result of repeatedly measuring ON/OFF operations, that is, set/reset operations. FIG. 6 shows a result of one-time ON/OFF sweep operation.

Referring to FIG. 5, it can be seen that a current level of a resistance change graph is divided into many different levels. Accordingly, the ionic species moving layer M10 may have a multi-level characteristic. Also, it can be seen that the resistance change of a PCMO layer may be made within a range of about ±4.0 V.

Referring to FIG. 6, it can be seen that the resistance change of a TaOx layer may take place within a voltage range of about ±2.5 V. Accordingly, a change in the resistance of the ionic species moving layer M10 may take place within a low voltage range of about ±2.5 V.

Figure 7:
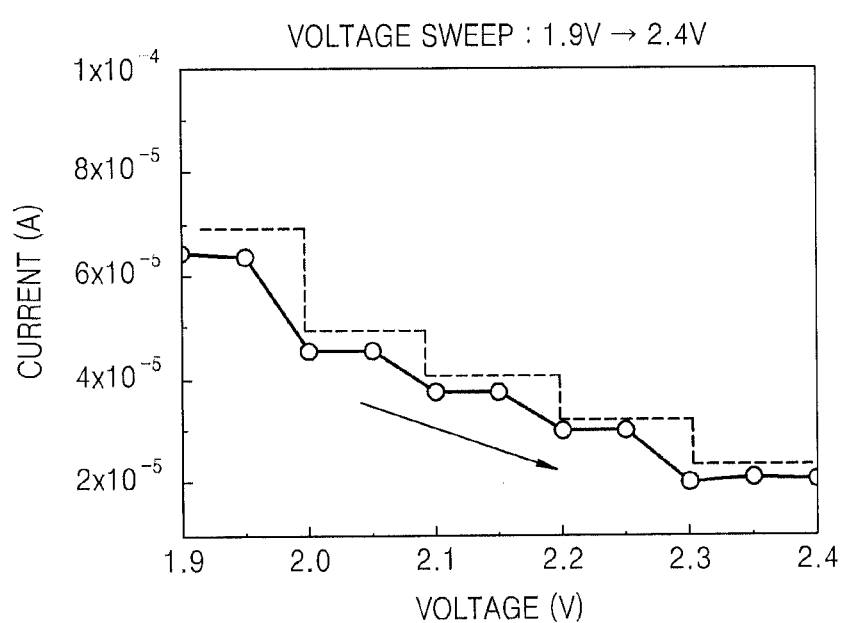
FIGS. 7 and 8 are graphs showing a current change according to a voltage sweep with respect to the structure of FIG. 4.
Figure 8:
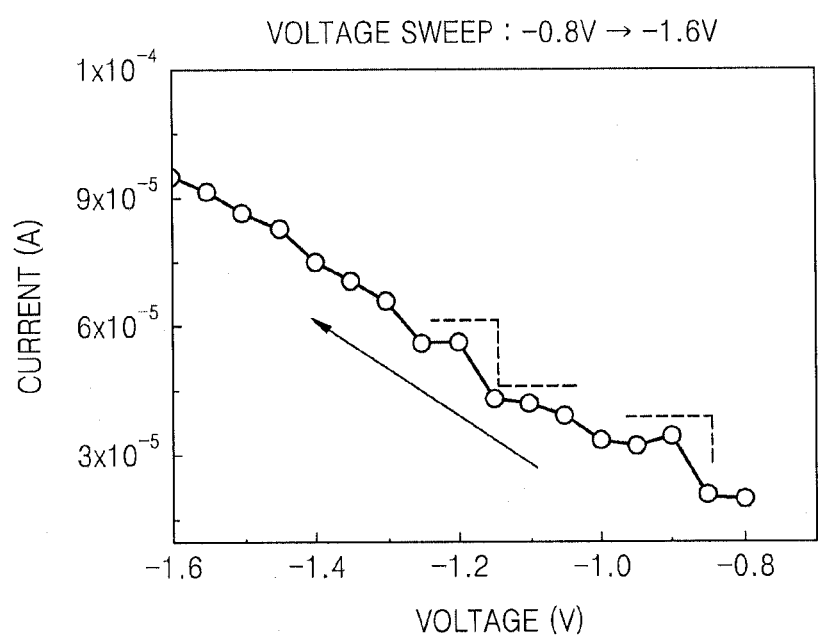

FIGS. 7 and 8 are graphs showing a current change according to a voltage sweep with respect to the structure of FIG. 4. In particular, FIG. 7 shows a result of the measurement of a current change while increasing the voltage between the two electrodes E10 and E20 from 1.9 V to 2.4 V, and FIG. 8 shows a result of the measurement of a current change while increasing, for example, increasing of an absolute value of, a voltage between the two electrodes E10 and E20 from −0.8 V to −1.6 V.

Referring to FIGS. 7 and 8, it can be seen that a current gradually decreases or increases according to the voltage sweep. Accordingly, the resistance of the structure shown in FIG. 4 may gradually decrease or increase according to a voltage sweep direction.

Figure 9A:
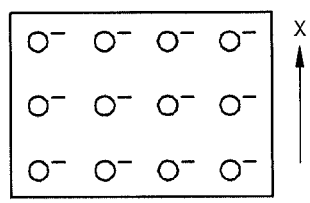
FIGS. 9A-9C are cross-sectional views illustrating examples of various ion distributions of the ionic species moving layer.
Figure 9B:
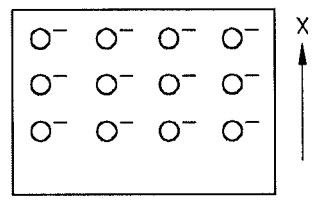
Figure 9C:
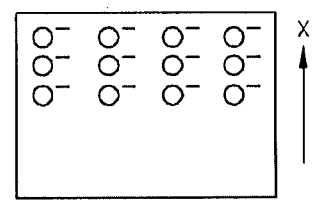

FIGS. 9A-9C are cross-sectional views illustrating examples of various ion distributions of the ionic species moving layer M10 described herein. It can be seen that oxygen ions are accumulated in the upper side, that is, toward the upper surface, shown between FIG. 9A and FIG. 9C. A change in a distribution of oxygen ions in the ionic species moving layer M10 may signify that the density of oxygen ions in a predetermined region may change. The ion distribution of the ionic species moving layer M10 may gradually change according to a voltage applied to the ionic species moving layer M10.

Figure 10:
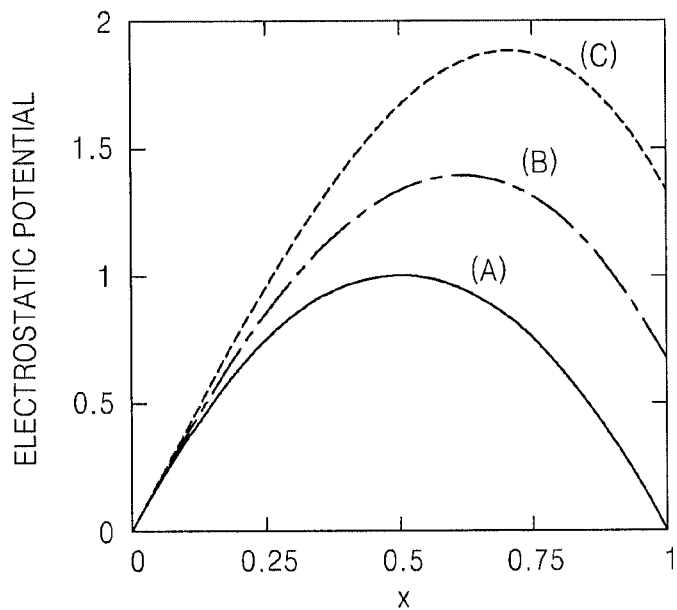
FIG. 10 is a graph showing electrostatic potential changes of an ionic species moving layer according to the ion distribution change in FIGS. 9A-9C.

FIG. 10 is a graph showing electrostatic potential changes of the ionic species moving layer M10 according to an ion distribution change in FIGS. 9A-9C. The graphs (A), (B) and (C) of FIG. 10 correspond to FIGS. 9A-9C, respectively. It can be seen from the result of FIG. 10 that the electrostatic potential gradually changes according to the ion distribution change.

Figure 11:
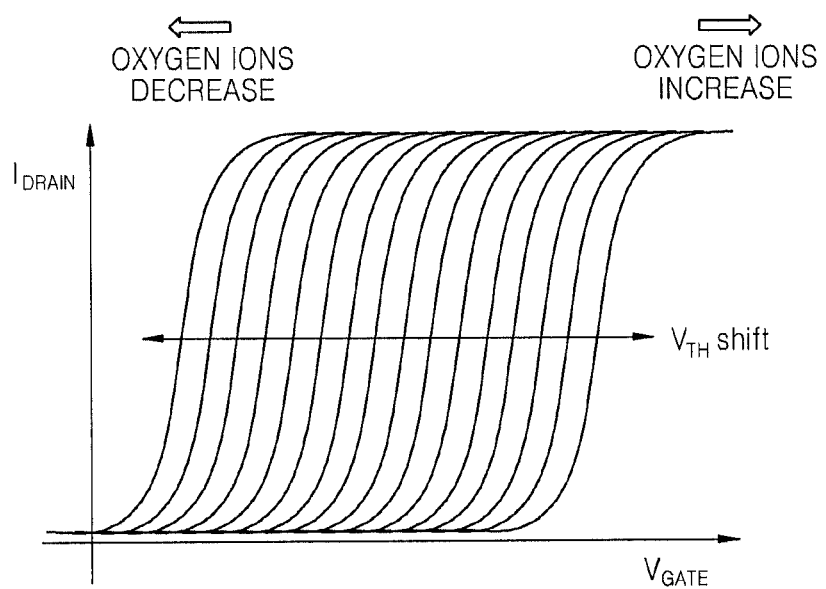
FIG. 11 is a graph showing a threshold voltage change according to a movement of ionic species of an ionic species moving layer of a nonvolatile memory transistor according to an embodiment of the present inventive concept.

FIG. 11 is a graph showing a threshold voltage change according to the movement of ionic species of an ionic species moving layer of a nonvolatile memory transistor according to an embodiment of the present inventive concept.

Referring to FIG. 11, as the number of oxygen ions increases in a portion of the ionic species moving layer, for example, the ionic species moving layer M1 of FIGS. 1 and 2, which is close to a channel region of the transistor, that is, a lower end portion, the threshold voltage may gradually increase in the positive (+) direction. This is because positive (+) charges may be accumulated in the channel region as the number of oxygen ions increase in a portion of the ionic species moving layer M1 close to the channel region. Thus, a higher voltage is required in order to form an n-channel. In FIG. 11, the number of oxygen ions is different than, for example, opposite the number of oxygen vacancies. Accordingly, as the number of oxygen vacancies decreases in the portion of the ionic species moving layer M1 close to the channel region, that is, the lower end portion, the threshold voltage may gradually increase in the positive (+) direction. As the oxygen ions or oxygen vacancies gradually move, the threshold voltage may gradually change. The movement of the ionic species and the change in the threshold voltage may be nonvolatile. In other words, the ionic species may move in response to the application of a voltage, and a final state may be continuously maintained when the application of a voltage is removed.

Figure 12:
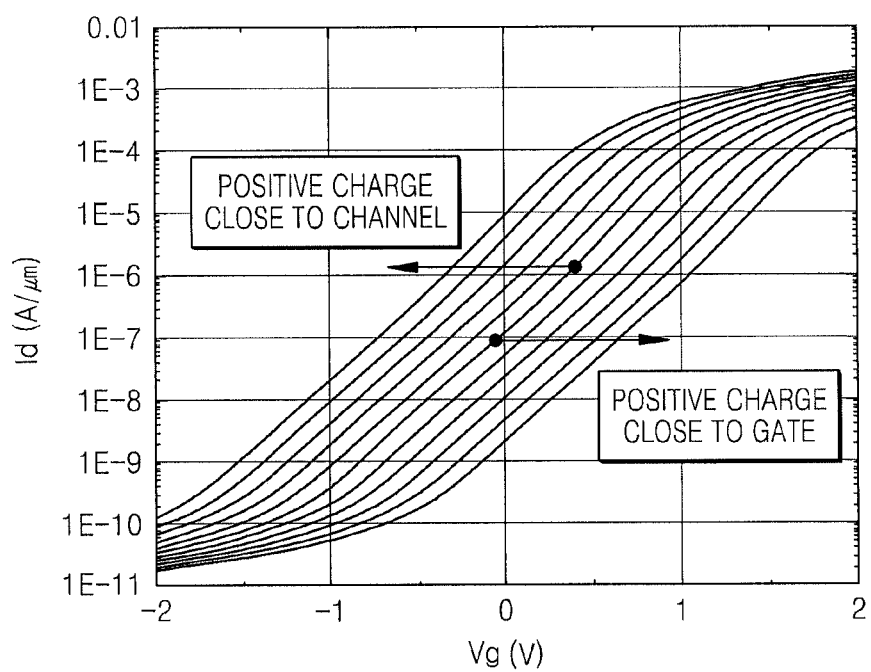
FIG. 12 is a graph showing a simulation result that shows a threshold voltage change according to a movement of an ionic species of an ionic species moving layer of a nonvolatile memory transistor according to an embodiment of the present inventive concept.

FIG. 12 is a graph showing a simulation result that shows a threshold voltage change according to the movement of an ionic species of an ionic species moving layer of a nonvolatile memory transistor according to an embodiment of the present inventive concept. A gate voltage Vg-drain current Id characteristic is evaluated while moving positive (+) ionic species toward the channel region or the gate electrode.

Referring to FIG. 12, as the positive (+) ionic species, that is, positive charges, move close to a gate electrode of the transistor, a threshold voltage of the memory transistor gradually increases. As the positive (+) ionic species move close to the channel region, the threshold voltage gradually decreases. Such a result can be similar to that shown in the graph of FIG. 11. Also, it can be seen from the graph of FIG. 12 that a drain current of a multi-level is output at a predetermined gate voltage, for example, 1 V. A multi-level drain current may be output according to a change in the threshold voltage.

A nonvolatile memory transistor according to the present embodiment may have a low operating voltage, for example, an operating voltage within a range of about ±5.0 V, and have a sufficiently large multi-level characteristic even when the memory transistor has a small size or related configuration parameter. In other words, as described in FIGS. 5 and 6, since a change in the resistance of an ionic species moving layer may be made at a low voltage within a range of about ±4.0 V or ±2.5 V, the nonvolatile memory transistor may operate in a low voltage range. Also, as described above with reference to FIGS. 11 and 12, since the threshold voltage of the memory transistor is gradually changed by gradually moving the ionic species of the ionic species moving layer, a multi-level characteristic of 16 levels or more may be easily obtained.

Since a flash memory in accordance with some embodiments uses a tunnel injection of electrons, an operating voltage thereof, can be relatively high, for example, about 10-20 V. Also, since the number of electrons trapped in the floating gate is limited, it is difficult to embody a multi-bit characteristic. However, according to the present embodiment, a nonvolatile device operating at a low voltage range and having a sufficiently large multi-level characteristic even in a small size, thereby overcomes the abovementioned problems otherwise associated with a flash memory.

Figure 13:
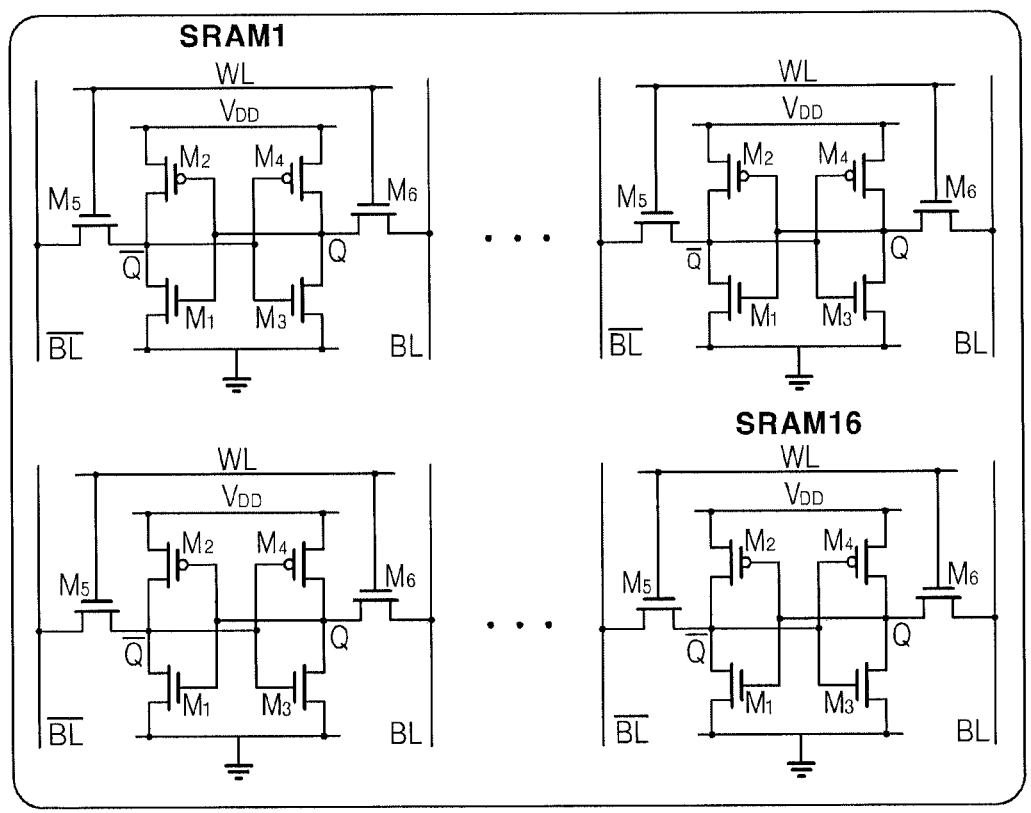
FIG. 13 is a circuit diagram illustrating an example of forming a 16-level device by using a conventional static random access memory (SRAM)

FIG. 13 is a circuit diagram illustrating an example of forming a 16-level (4-bit) device by using a conventional static random access memory (SRAM).

Referring to FIG. 13, in order to configure a 16-level (4-bit) device with a conventional SRAM, a plurality of SRAMS, e.g., 16 SRAMs, are needed along with a peripheral circuit (not shown). Each SRAM can include 6 transistors. Accordingly, when a 16-level (4-bit) device is configured with a conventional SRAM, at least 96 transistors are needed.

However, the nonvolatile memory transistor according to the present embodiment, a multi-level configuration of 16 levels or more may be embodied with respect to a single transistor. Accordingly, when a predetermined circuit is configured using the nonvolatile memory transistor according to the present embodiment, the number of required unit devices may be drastically reduced and the structure of a circuit may be simplified. Accordingly, the size of an overall system may be greatly reduced.

The nonvolatile memory transistor according to the present embodiment may be used for a variety of purposes, for example, for various electronic apparatuses and logic devices. In particular, the nonvolatile memory transistor may be applied to a synapse device/circuit. A synapse is well-known for referring to a junction for connecting neuron cells and is important for learning and memorization. As a synapse is reinforced whenever a transfer signal flows through the synapse, when a voltage is applied to a gate electrode of the nonvolatile memory transistor according to the present embodiment, an electric characteristic of the ionic species moving layer changes and thus the threshold voltage of the transistor may gradually (accumulatively) change. Also, a change of a threshold voltage may be nonvolatile. Accordingly, the nonvolatile memory transistor according to the present embodiment may be applied to a synapse device/circuit. Since the nonvolatile memory transistor may have a multi-level characteristic of 16 levels or more and may operate at a low voltage range, when a synapse device/circuit is configured by using the nonvolatile memory transistor, the size of a device/circuit may be greatly reduced and power consumption may be reduced. Also, since the nonvolatile memory transistor operates at a low voltage, the reliability thereof may be improved.

Figure 14:
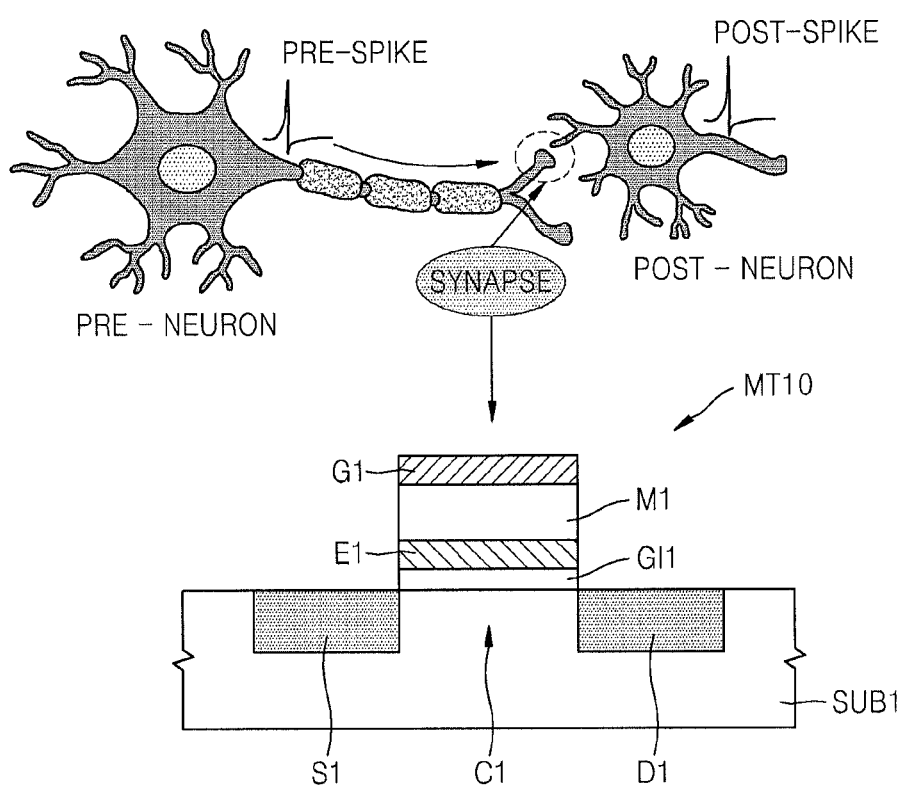
FIG. 14 is a conceptual diagram illustrating an application of a nonvolatile memory transistor according to an embodiment of the present inventive concept to a synapse device.

FIG. 14 is a conceptual diagram illustrating a case of applying a nonvolatile memory transistor MT10 according to an embodiment of the present inventive concept to a synapse device.

Referring to FIG. 14, when a synapse, or a junction between a pre-neuron and a post-neuron, is configured in a circuit, the nonvolatile memory transistor MT10 according to the present embodiment may be employed. The pre-neuron may input a pre-spike signal to a synapse. The synapse may transfer a predetermined synaptic signal to the post-neuron. The post-neuron may generate a post-spike signal. The nonvolatile memory transistor MT10 may connect a pre-synaptic neuron circuit N1 and a post-synaptic neuron circuit N2. Such a configuration may be illustrated in a circuit shown in FIG. 15.

Figure 15:
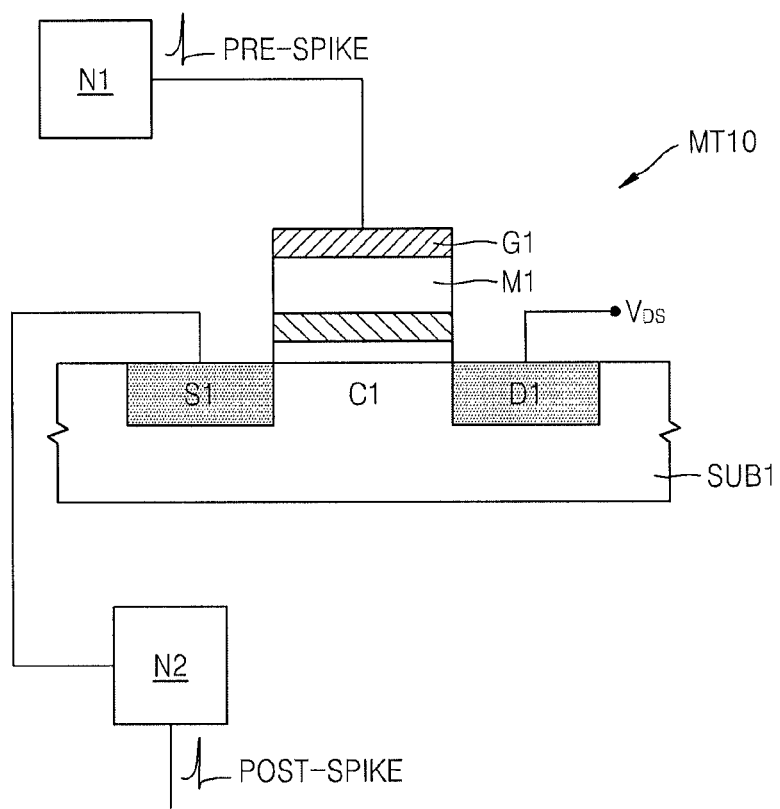
FIG. 15 is a cross-sectional diagram illustrating a synapse device including a nonvolatile memory transistor according to an embodiment of the present inventive concept.

Referring to FIG. 15, a gate electrode G1 of the nonvolatile memory transistor MT10 may be connected to the pre-synaptic neuron circuit N1. A source S1 of the nonvolatile memory transistor MT10 may be connected to the post-synaptic neuron circuit N2. A pre-spike signal may be applied from the pre-synaptic neuron circuit N1 to the gate electrode G1. A post-synaptic current may flow toward the post-synaptic neuron circuit N2 via the source S1. The post-synaptic neuron circuit N2 may generate a post-spike signal. A predetermined voltage $V_{DS}$ may be applied to the drain D1 of the nonvolatile memory transistor MT10.

As the pre-spike signal is repeatedly applied to the gate electrode G1, the threshold voltage of the nonvolatile memory transistor MT10 may be gradually changed in the positive (+) direction or negative (−) direction. When a change in the threshold voltage exceeds a predetermined critical point, the nonvolatile memory transistor MT10 may be turned on by the pre-spike signal. At this time, the post-synaptic current may flow toward the post-synaptic neuron circuit N2 via the source S1.

Figure 16:
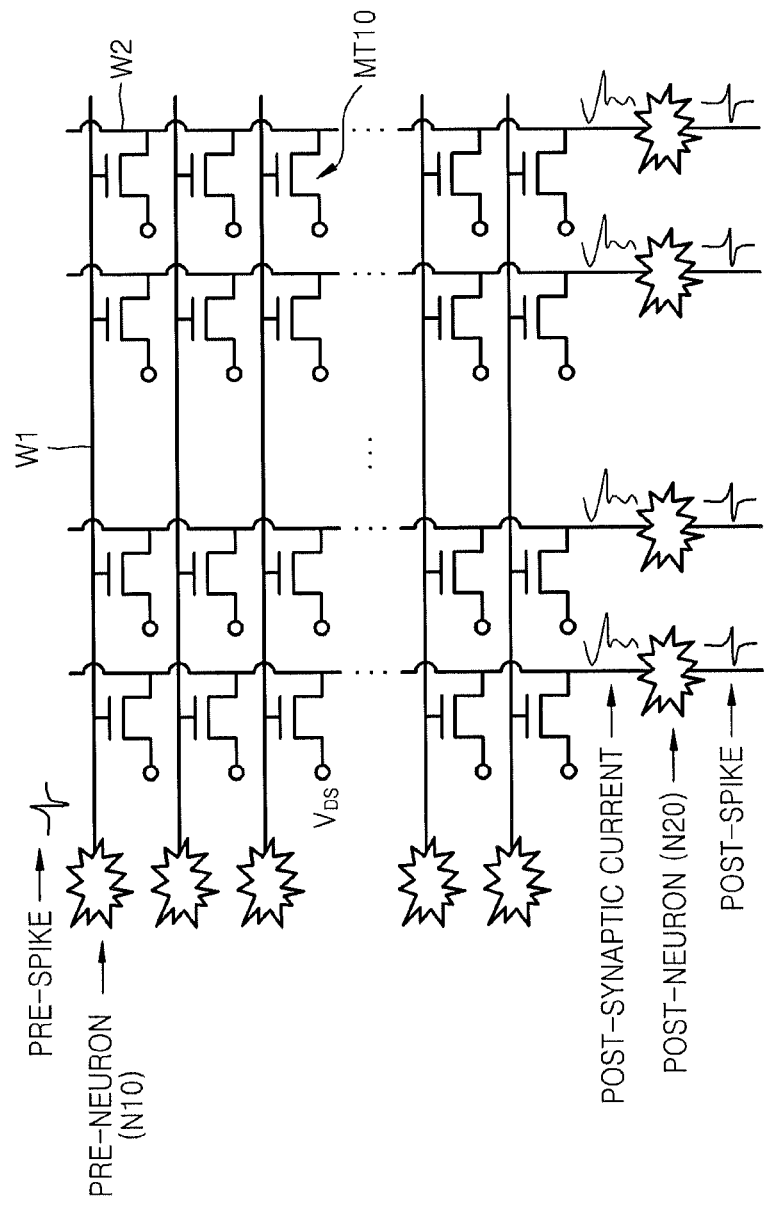
FIG. 16 is a circuit diagram illustrating a synapse array device including a nonvolatile memory transistor according to an embodiment of the present inventive concept.

FIG. 16 is a circuit diagram illustrating a synapse array device including a nonvolatile memory transistor MT10, according to an embodiment of the present inventive concept.

Referring to FIG. 16, a plurality of nonvolatile memory transistors MT10 may be arranged in a plurality of rows and columns. A plurality of first wirings W1 and a plurality of second wirings W2 may be arranged to cross each other. The nonvolatile memory transistor MT10 may be located at each intersection of the first and second wirings W1 and W2. The first wiring W1 may be connected to the gate electrode of the nonvolatile memory transistor MT10. The second wiring W2 may be connected to the source of the nonvolatile memory transistor MT10. The first wiring W1 may be connected to a pre-synaptic neuron circuit N10. The second wiring W2 may be connected to a post-synaptic neuron circuit N20. The predetermined voltage $V_{DS}$ may be applied to a drain of the nonvolatile memory transistor MT10.

The pre-spike signal may be applied from the pre-synaptic neuron circuit N10 to the gate electrode of the nonvolatile memory transistor MT10 via the first wiring W1. The post-synaptic current may flow toward the post-synaptic neuron circuit N20 via the source of the nonvolatile memory transistor MT10. The post-synaptic neuron circuit N20 may generate the post spike signal.

Figure 17:
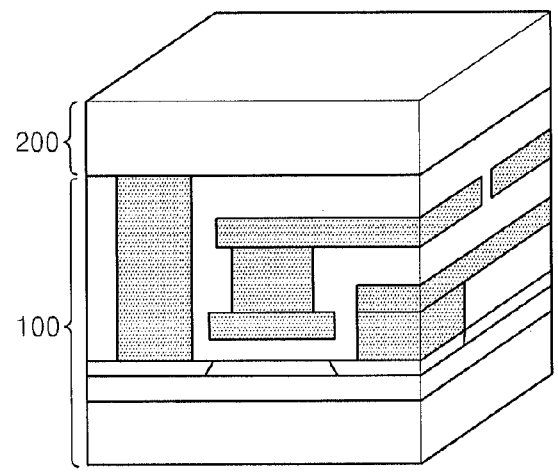
FIG. 17 is a perspective view illustrating a neuromorphic device including a synapse device according to an embodiment of the present inventive concept.

FIG. 17 is a perspective view illustrating a neuromorphic device including a synapse device 200 according to an embodiment of the present inventive concept.

Referring to FIG. 17, the neuromorphic device may include a complementary metal-oxide-semiconductor (CMOS) neuron circuit 100 and a synapse device 200 connected to the CMOS neuron circuit 100. The CMOS neuron circuit 100 may be provided on a predetermined substrate, for example, a silicon (Si) substrate. The CMOS neuron circuit 100 may include a pre-synaptic neuron circuit and a post-synaptic neuron circuit, for example, described herein. The synapse device 200 may have an array structure according to the present embodiment, for example, the array structure of FIG. 16. For convenience of explanation, the synapse device 200 is schematically illustrated. The structure of the neuromorphic device of FIG. 17 is exemplary and a variety of modifications thereof may be available.

Figure 18:
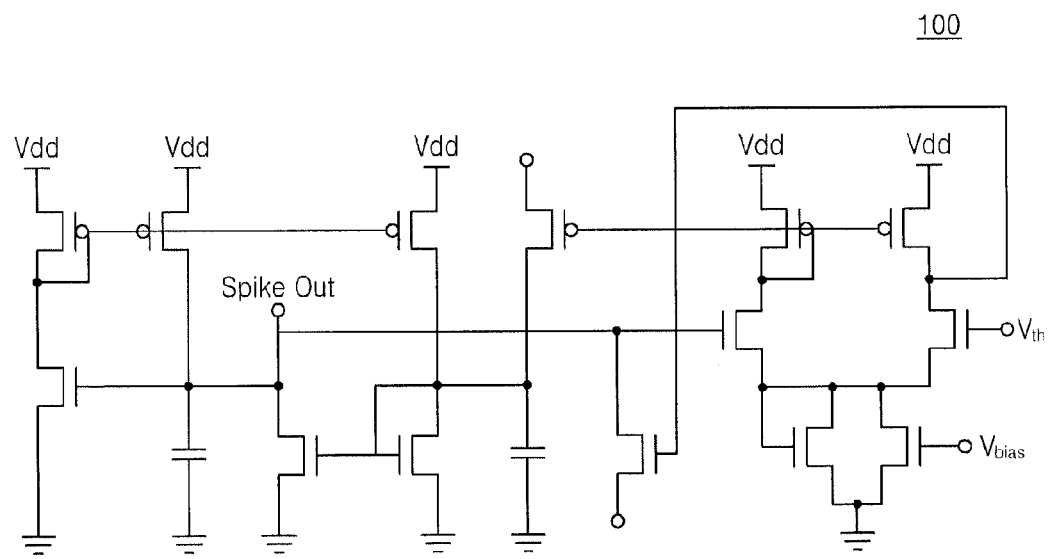
FIG. 18 is a circuit diagram illustrating an exemplary structure of a CMOS neuron circuit of FIG. 17.

The CMOS neuron circuit 100 of FIG. 17 may have, for example, a circuit structure similar or the same as that illustrated in FIG. 18. The structure of the CMOS neuron circuit 100 is well known, and thus, a detailed description thereof will be omitted herein.

The nonvolatile memory transistors according to the embodiments of the present inventive concept may be applied to a variety of electronic devices or logic devices. For example, as described above, the nonvolatile memory transistors may be applied to the synapse device, and the synapse device may be applied to the neuromorphic device. Simultaneous interpretation is one of the application fields related to this technology. Also, the nonvolatile memory transistor may be applied to a multi-valued logic that simultaneously operates multi-levels with a single unit. In this case, an operation speed may be increased and the size of a device may be reduced. The nonvolatile memory transistor may be used for a device performing analog computation with hybrid. CMOS/multi-value circuits. Also, the nonvolatile memory transistor according to the present inventive concept may be applied to a circuit or chip having an artificial intelligence function, a circuit or chip operating as a neural network, technology to overcome an information process limit of an existing digital method, a circuit or chip capable of performing a neuron-like operation, a device capable of simultaneously switching and memorizing, and so on.

A method of operating a nonvolatile memory transistor according to an embodiment of the present inventive concept is summarized as follows. The method of operating a nonvolatile memory transistor may include moving ionic species in an ionic species moving layer by applying a voltage to a gate electrode and activating the nonvolatile memory transistor. In the moving of the ionic species, the voltage applied to the ionic species moving layer may be a low voltage within a range of about ±5.0 V. In detail, in the structure of FIGS. 1 through 3 and 14, ionic species may be moved in the ionic species moving layers M1 and M2 by applying a predetermined voltage to the gate electrode G1. The movement of the ionic species may change the threshold voltages of the memory transistors MT1, MT2, MT3, and MT10, respectively. The threshold voltages may be gradually changed by repeatedly applying a voltage to the gate electrode G1, for example, gradually changed in the positive (+) direction or negative (−) direction. When the change of the threshold voltage exceeds a predetermined critical point, the memory transistors MT1, MT2, MT3, and MT10 may be turned on by the voltage. Accordingly, a predetermined signal, for example, a current/voltage signal, may be output through the source S1. However, the operation method is exemplary and may be diversely modified according to the applied fields and purposes.

It should be understood that the exemplary embodiments described herein should be considered in a descriptive sense only and not for purposes of limitation. For example, those of ordinary skill in the art to which the present inventive concept pertains would understand that the structure of the nonvolatile memory transistor of FIGS. 1 through 3 may be modified in various ways. In detail, one or more other material layers may be further provided between the gate insulation layer GI1 and the gate electrode G1 in addition to ionic species moving layers M1 and M2 and the conductive layer E1. Configurations of the source S1, the drain D1 and the channel element C1 may be modified in various ways. Also, the structures of the synapse device of FIG. 15 through 17 and the apparatus including the synapse device may be diversely modified as well. Descriptions of features or aspects within each embodiment should typically be considered as available for other similar features or aspects in other embodiments.

What is claimed is:

1. A nonvolatile memory transistor comprising:
   a channel element;
   a gate electrode corresponding to the channel element;
   a gate insulation layer between the channel element and the gate electrode;
   an ionic species moving layer between the gate insulation layer and the gate electrode; and
   a source and a drain separated from each other with respect to the channel element, wherein a motion of an ionic species at the ionic species moving layer occurs according to a voltage applied to the gate electrode, wherein a threshold voltage changes according to the motion of the ionic species, wherein the nonvolatile memory transistor has a multi-level characteristic including at least sixteen levels, and wherein the ionic species moving layer has a multilayer structure.

2. The nonvolatile memory transistor of claim 1, wherein the ionic species moving layer comprises a variable resistance material.

3. The nonvolatile memory transistor of claim 1, wherein the ionic species moving layer comprises a bipolar memory layer.

4. The nonvolatile memory transistor of claim 1, wherein the ionic species moving layer comprises at least one of PrCaMnO (PCMO), Ti oxide, Ta oxide, Ni oxide, Zn oxide, W oxide, Co oxide, Nb oxide, TiNi oxide, LiNi oxide, InZn oxide, V oxide, SrZr oxide, SrTi oxide, Cr oxide, Fe oxide, Cu oxide, Hf oxide, Zr oxide, Al oxide, and a mixture thereof.

5. The nonvolatile memory transistor of claim 4, wherein the ionic species moving layer comprises PCMO.

6. The nonvolatile memory transistor of claim 1, wherein the ionic species moving layer comprises negative ionic species and the threshold voltage increases as a concentration of the negative ionic species in the ionic species moving layer increases in a direction toward the gate insulation layer.

7. The nonvolatile memory transistor of claim 1, wherein the ionic species moving layer comprises positive ionic species and the threshold voltage decreases as a concentration of the positive ionic species in the ionic species moving layer increases in a direction toward the gate insulation layer.

8. The nonvolatile memory transistor of claim 1, wherein the ionic species moving layer comprises at least one of oxygen ions or oxygen vacancies as the ionic species.

9. The nonvolatile memory transistor of claim 1, further comprising a conductive layer between the gate insulation layer and the ionic species moving layer.

10. A synapse device comprising a nonvolatile memory transistor, the nonvolatile memory transistor comprising:
    a channel element;
    a gate electrode corresponding to the channel element;
    a gate insulation layer between the channel element and the gate electrode;
    an ionic species moving layer between the gate insulation layer and the gate electrode; and
    a source and a drain separated from each other with respect to the channel element, wherein a motion of an ionic species at the ionic species moving layer occurs according to a voltage applied to the gate electrode, wherein a threshold voltage changes according to the motion of the ionic species, and wherein the nonvolatile memory transistor has a multi-level characteristic, wherein the gate electrode of the nonvolatile memory transistor is connected to a pre-synaptic neuron circuit and a source of the nonvolatile memory transistor is connected to a post-synaptic neuron circuit.

11. The synapse device of claim 10, wherein the nonvolatile memory transistor includes a plurality of nonvolatile memory transistors arranged in a plurality of rows and columns.

12. The synapse device of claim 11, further comprising:
    a plurality of first wirings; and
    a plurality of second wirings crossing the plurality of first wirings, wherein the plurality of nonvolatile memory transistors are located at intersections of the plurality of first wirings and the plurality of second wirings.

13. The synapse device of claim 12, wherein the plurality of first wirings are connected to a pre-synaptic neuron circuit and the plurality of second wirings are connected to a post-synaptic neuron circuit.

* * * * *